United States Patent
Heid

(10) Patent No.: US 6,307,374 B1
(45) Date of Patent: Oct. 23, 2001

(54) CONTROL DEVICE FOR PRESCRIBING A TIME-VARIABLE OUTPUT QUANTITY

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/393,971

(22) Filed: Sep. 10, 1999

(30) Foreign Application Priority Data

Sep. 14, 1998 (DE) .............................................. 198 42 035

(51) Int. Cl.[7] ........................................................ G01V 3/00
(52) U.S. Cl. ............................................. 324/322; 324/318
(58) Field of Search ..................................... 324/322, 314, 324/309, 307, 318, 311, 312, 313; 375/376; 348/580

(56) References Cited

U.S. PATENT DOCUMENTS

| 3,975,675 | * | 8/1976 | Dunand et al. | 324/312 |
| 4,432,009 | * | 2/1984 | Reitmeier et al. | 348/580 |
| 4,930,142 | * | 5/1990 | Whiting et al. | 375/376 |
| 5,349,296 | | 9/1994 | Cikotte et al. | 324/309 |

FOREIGN PATENT DOCUMENTS 198 18 292    3/1998   (DE) .

* cited by examiner

*Primary Examiner*—Hezron Williams
*Assistant Examiner*—Tiffany A. Fetzner
(74) *Attorney, Agent, or Firm*—Schiff Hardin & Waite

(57) ABSTRACT

In a control device for prescribing a time-variable output quantity, a slope value of the output quantity is prescribed and supplied to a clocked adder. The adder adds a quantity prescribed by the slope value to the respectively current output quantity with every clock pulse.

8 Claims, 3 Drawing Sheets

CONTROL DEVICE FOR PRESCRIBING A TIME-VARIABLE OUTPUT QUANTITY

BACKGROUND OF THE INVENTION

1. Field of the Invention

The present invention is directed to a control device for prescribing a time-variable output quantity, particularly for use in setting a time curve of a gradient current supplied to a gradient coil in a magnetic resonance tomography apparatus by a gradient amplifier.

2. Description of the Prior Art

The exact prescription of a time-variable output quantity is required, for example, for setting a gradient current in a gradient coil of a magnetic resonance tomography apparatus. The time curve of the gradient current must be exactly prescribed in accordance with the measuring sequence which is employed for operating such an apparatus. For example, in the control technique disclosed in U.S. Pat. No. 5,349,296, control data sets are essentially pre-calculated before the sequence start. Gradient pulses are defined by their starting amplitude and ending amplitude, and a control computer emits corresponding ramp signals as an output. The rise and decay rates are limited by the performance capability of the gradient amplifiers and by the inductivity of the gradient coils. Given such a prescription of starting and ending values for ramps of gradient pulses, care must always be exercised to insure that the allowable rise and decay rates are not exceeded. This involves increased calculating outlay.

In a number of nuclear magnetic resonance tomography apparatuses commercially offered by Siemens AG, time-variable output quantities for gradient coil systems are calculated by digital signal processors, which are appropriately programmed for this purpose. For registering oblique and double-oblique magnetic resonance tomography images, multiplications with rotational matrices must, among other things, be implemented by the signal processor for calculating the corresponding output quantity. For eliminating calculating time, increments are formed for the output quantity for this purpose, and these increments are subjected to the aforementioned multiplication. Finally, the output quantity is formed by adding a multiplied increment to the momentary value of the output quantity at specific clocked times. In order to keep the influence of rounding errors low, a 16-bit signal processor undertakes the calculations using double word arithmetic of 32 bits. Monitoring of allowable rise and decay rates can be implemented in a simple way with the aforementioned method on the basis of the increments. The aforementioned method for prescribing a time-variable output quantity for the gradient currents, however, occupies calculating power of the digital signal processor that is then not available for other tasks.

In nuclear magnetic resonance tomography, frequency and phase encoding of the resonance signals of the origination of the signals dependent on the location is effected in different directions by gradients, the data encoded in this manner being referred to as the k-space presentation. The following definition applies for the k-space:

$$k_y(t) = \gamma \int_0^t G_y(t')dt'$$

$$k_y(t) = \gamma \int_0^t G_y(t')dt'$$

$$k_z(t) = \gamma \int_0^t G_z(t')dt'$$

wherein $\gamma$ is thereby the Larmor constant and $G_x$, $G_y$, $G_z$ are respective magnetic field gradients in the x, y and z directions of a Cartesian coordinate system. The resolution of the k-space (i.e., the fineness of the incrementation of the data values therein) is critical for the measuring precision. It follows from the aforementioned equations for the k-space that the smallest discrete incrementation is defined by a time grid $\Delta t$ and the rastering of the amplitude of the gradients G.

The time grid $\Delta t$ is prescribed by the digital control system employed i.e., by its digital signal processors, and typically is 10 $\mu$s. Usually, physical quantities are presented with 16 bits by the digital signal processors of the control system. If a maximum amplitude of ±25 mT is assumed, approximately 1 $\mu$T is obtained as the smallest amplitude unit. The smallest presentable k-space distance between successive values then amounts to approximately 1 $\mu$T·10 $\mu$s. This resolution, however, is already too coarse for some applications.

SUMMARY OF THE INVENTION

An object of the present invention is to provide a control device for prescribing a time-variable output quantity such that an exact resolution size of the output quantity is possible in a simple way and the aforementioned disadvantageous are avoided.

The above object is achieved in accordance with the principles of the present invention in a control device for prescribing a time-variable output quantity having an input for prescribing a slope value of the output quantity, and an output for the output quantity, and a clocked adder having an adder output connected to the output of the control device which adds a quantity determined by the slope value at the control device input to the current (existing) output quantity at every clock pulse.

The application of such a device is advantageous particularly when neither the bit depth nor the clock of the overall control system should be, or can be, increased to achieve a finer resolution of the k-space and where it is desirable for processors of the control system to have more calculating power available for other tasks.

DESCRIPTION OF THE PREFERRED EMBODIMENTS

Figure 1:
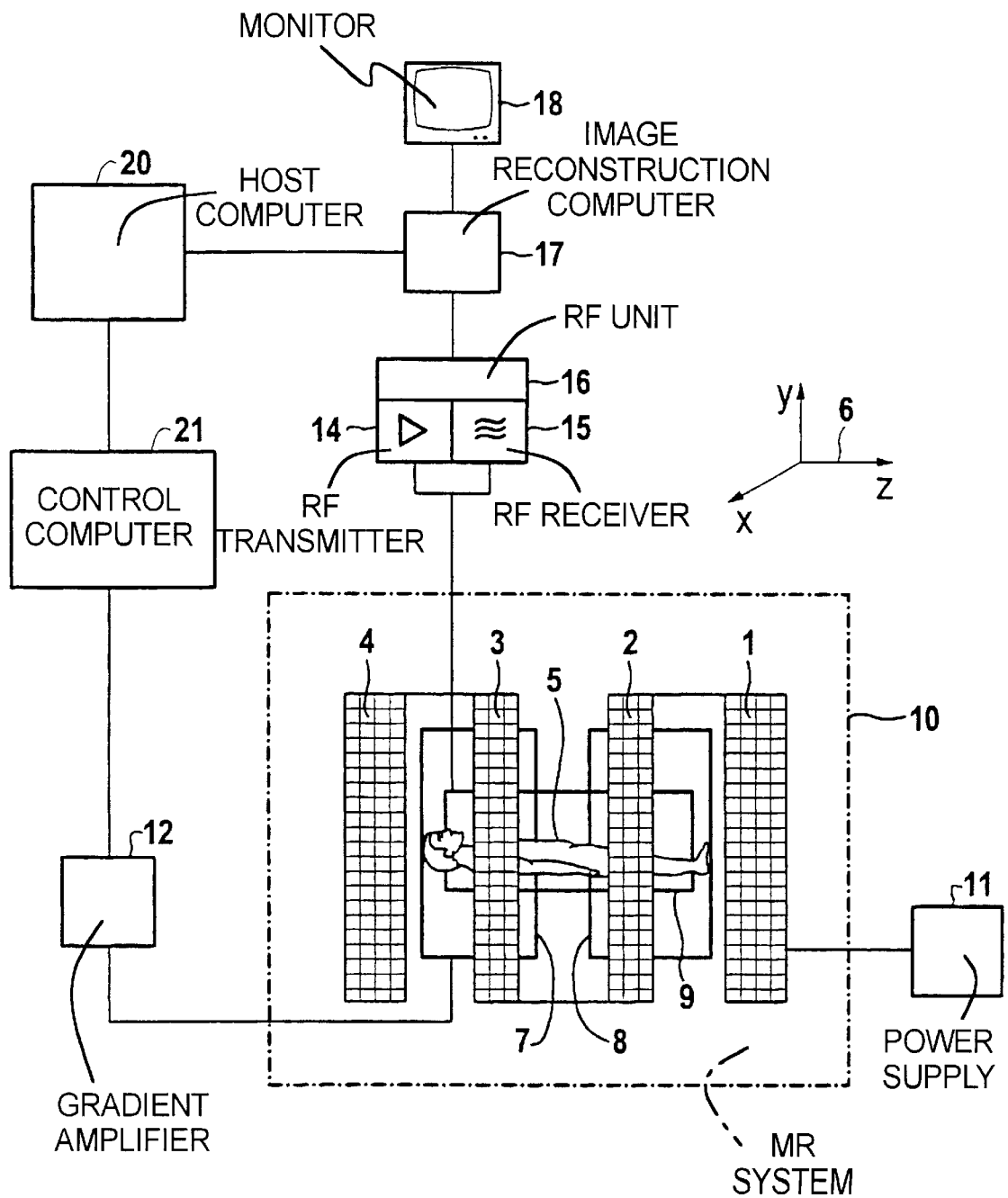
FIG. 1 schematically illustrates the basic components of a nuclear magnetic resonance tomography apparatus.

An exemplary embodiment of the invention is described below in conjunction with the employment thereof in a nuclear magnetic resonance tomography apparatus. To this end, FIG. 1 first shows the standard arrangement of the compounds of a nuclear magnetic resonance tomography apparatus in schematic fashion.

This apparatus is composed of a magnet system 1 through 4, which generates a uniform basic field, that is supplied by a power supply 11. Gradient coil systems 7, 8 that are driven by a gradient amplifier 12 are disposed in the magnet system. The gradient coil systems are implemented for generating magnetic field gradients in three spatial directions x, y, z of a coordinate system 6. The examination subject 5 is surrounded by a radio-frequency antenna 9 that is connected to a radio-frequency transmission unit 14 as well as to a radio frequency reception unit 15. The magnet system 1 through 4, the gradient coil systems 7 and 8 and the radio-frequency antenna 9 form an MR system 10. The radio frequency transmission unit 14 and the radio frequency reception unit 15 are components of a radio frequency system 16 wherein, among other things, the received signals are sampled and demodulated in phase-sensitive fashion. An image is produced from the demodulated signals with an image reconstruction computer 17, and is forwarded to a host computer 20 and is displayed on a monitor 18. The entire apparatus is controlled by the host computer 20. The hardware control is assumed by a control computer 21 that is connected to the host computer 20.

Figure 2:
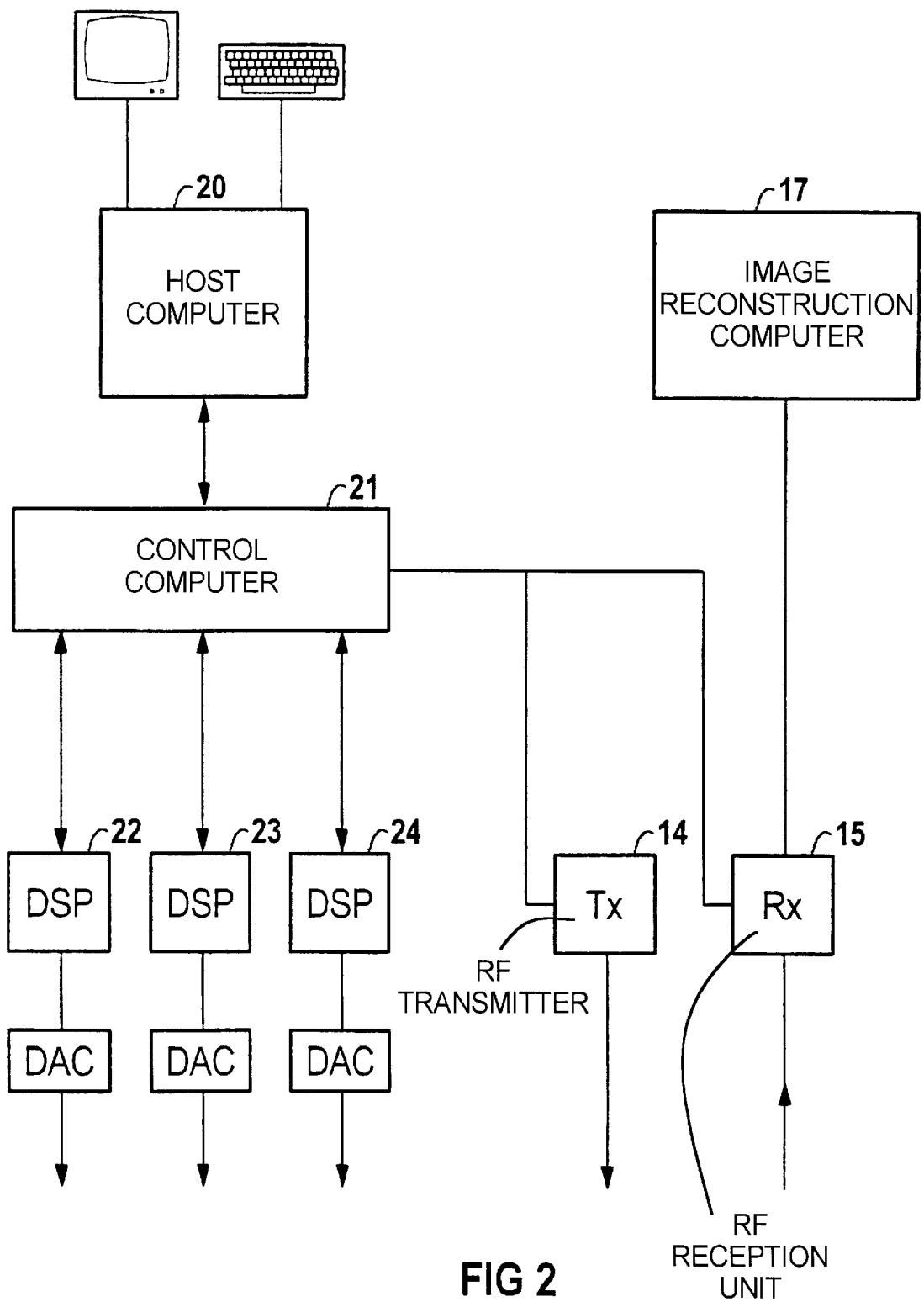
FIG. 2 is a block diagram of the overall system control for the apparatus of FIG. 1 wherein each of the digital signal processors contains a control device in accordance with the invention.

The overall system control is shown in somewhat greater detail in FIG. 2. The control computer 21 contains a standard CPU in which the actual measuring sequence is executed. At least one radio frequency transmission unit 14, at least one radio frequency reception unit 15 and three digital signal processors (DSP) 22, 23 and 24 are coupled to this CPU. The digital signal processors 22, 23 and 24 have respective outputs connected to respective digital-to-analog converters (DAC). The gradient DSPs can, via interrupts, request data from the control CPU as soon as their local buffer has been emptied. Further, there is a digital connection to the image reconstruction computer 17 in order to synchronize the data acquisition with the image reconstruction. A bus to the host computer 20 maintains a real-time connection between the host computer 20 and the control CPU in order to give the user the possibility of influencing the measuring sequence during the measurement as well.

Figure 3:
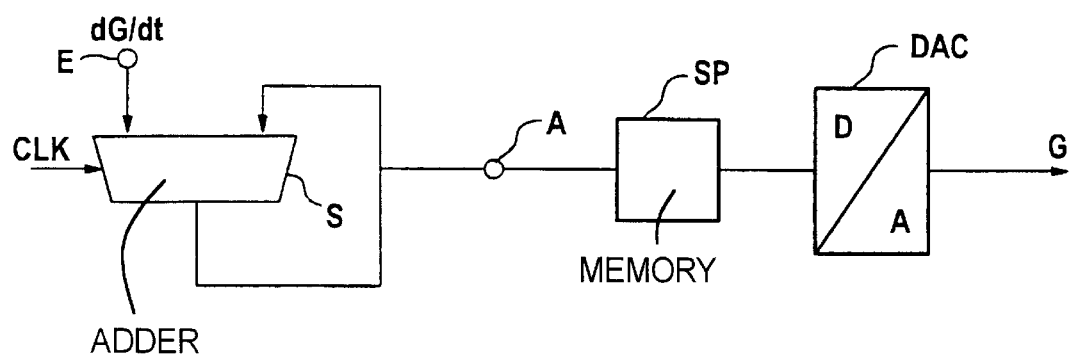
FIG. 3 an exemplary embodiment of a control device in accordance with the invention.

The digital signal processors 22 through 24 each contain a circuit according to FIG. 3 that is constructed as a separate hardware module. The change rate dG/dT of the respective gradient current G is prescribed at the input E by the control CPU 21. This is conducted to a first input of a digital adder S that is controlled with a clock CLK. The output of the adder S is connected to its second input, so that the change rate dG/dT is added to the respective momentary value G at every clock pulse. The output A is followed by a digital-to-analog converter DAC that converts the digital reference value acquired in this way into an analog value for the respective gradient current. As warranted, a memory unit SP, whose purpose shall be described in greater detail later, can be inserted between the output A and the digital-to-analog converter DAC.

Since the circuit according to FIG. 3 is constructed as a separate hardware module, the adder S can be operated with a greater bit depth (resolution) than the remaining system control. The overall system control, for example, typically generates with 16 bits and a 16 bit digital-to-analog converter is also utilized, but a 32 bit adder S can be utilized without great outlay. The clock CLK can also be higher than that of the system control, for example 20 ns. The smallest displayable k-space distance thus becomes significantly smaller compared to the example cited at the outset. The slope of ramps of the gradient pulses can be correspondingly finely predetermined. Given too coarse of a rastering in the definition of the change rate, errors would accumulate to a disturbing extent.

Prescribing the change rates instead of amplitude values assures that the change rates that can accepted by the system are not exceeded. Further, it is assured from the outset that only realizable gradient current curves arise, for example no discontinuity occurs in the reference value for the gradient current curve.

As a result of prescribing change rates, the illustrated circuit is suited for generating trapezoidal pulses, however, arbitrary pulse shapes can be generated when the values generated with the circuit are converted into modified values via a table. This table can, for example according to FIG. 3, be deposited in a memory SP that is inserted between the output A and the digital-to-analog converter DAC. For example, the trapezoidal shape can be converted into a sinusoidal shape with such a table by employing each value at the output A as an address for a corresponding table value, this table value being supplied from the output of the memory SP to the digital-to-analog converter DAC.

The illustrated circuit can be particularly advantageously utilized in conjunction with a system control as disclosed in German OS 198 18 292. A sequence program in the form of a k-space structure is thereby prescribed and a control data set is calculated in the spatial domain for gradients, radio frequency pulses and sampling of the nuclear magnetic resonance signals during the execution time of the pulse sequence.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance tomography apparatus comprising:
    a magnetic resonance data acquisition system which acquires magnetic resonance data using a plurality of operating parameters;
    a system control for setting said operating parameters, with a system control resolution, for said magnetic resonance data acquisition system; and
    a control device connected between said system control and said magnetic resonance data acquisition system for setting at least one of said operating parameters as a time-variable output quantity, with a resolution finer than said system control resolution, said control device comprising an input at which a slope value for said output quantity is present, and an output for said output quantity, and a clock adder, supplied with clock pulses, having an adder output connected to said output of said control device and an adder input connected to said input of said control device, said adder having a further adder input connected to said adder output, and said adder adding a current output quantity to a quantity dependent on said slope value at each of said clock pulses.

2. A magnetic resonance tomography apparatus as claimed in claim 1 wherein said adder is a digital adder, and wherein said slope value is a digital value.

3. A magnetic resonance tomography apparatus as claimed in claim 2 wherein said adder has a bit resolution which is larger than a bit resolution of said slope value.

4. A magnetic resonance tomography apparatus as claimed in claim 2 wherein said slope value is produced with a slope value clock signal, and wherein said clock pulses supplied to said adder have a higher frequency than said slope value clock signal.

5. A magnetic resonance tomography apparatus as claimed in claim 2 further comprising a digital-to-analog converter connected to said output, said digital-to-analog converter having a bit resolution which is less than a bit resolution of said adder.

6. A magnetic resonance tomography apparatus as claimed in claim 2 further comprising a memory connected to said output containing a table, said table allocating other respective values to output values at said output of said control device.

7. A magnetic resonance tomography apparatus as claimed in claim 1 wherein said adder produces a signal at said output representing a trapezoidal shape.

8. A magnetic resonance tomography apparatus as claimed in claim 1 wherein said magnetic resonance data acquisition system includes a gradient coil and wherein said output quantity is a current for said gradient coil.

* * * * *